US008335325B2

(12) United States Patent
Okabayashi

(10) Patent No.: US 8,335,325 B2
(45) Date of Patent: Dec. 18, 2012

(54) AUDIO SIGNAL PROCESSING APPARATUS MIXING PLURALITY OF INPUT AUDIO SIGNALS

(75) Inventor: Masaaki Okabayashi, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 1323 days.

(21) Appl. No.: 12/042,463

(22) Filed: Mar. 5, 2008

(65) Prior Publication Data

US 2008/0219476 A1 Sep. 11, 2008

(30) Foreign Application Priority Data

Mar. 8, 2007 (JP) ................................. 2007-058401

(51) Int. Cl.
*H04B 1/00* (2006.01)
*H03G 9/00* (2006.01)
*H03G 3/00* (2006.01)
*G10H 1/08* (2006.01)

(52) U.S. Cl. ........ 381/119; 381/102; 381/104; 381/107; 84/625; 84/660

(58) Field of Classification Search .................. 381/119, 381/102–109; 369/4; 700/94; 84/625, 660, 84/600–610
See application file for complete search history.

(56) References Cited

U.S. PATENT DOCUMENTS 5,396,618 A * 3/1995 Fukui et al. ..................... 714/30
7,088,834 B2 * 8/2006 Takemoto et al. ............ 381/104

OTHER PUBLICATIONS

PM5D Digital Mixing Console PM5D/PM5D-RH Owner's Manual, Yamaha Corporation, 2004.

* cited by examiner

*Primary Examiner* — Devona Faulk
(74) *Attorney, Agent, or Firm* — Morrison & Foerster LLP

(57) ABSTRACT

An audio signal processing apparatus comprises input channels, a mix bus, a volume level controller, a path disconnector that connects or disconnects a path from each input channel to the mix bus, a signal selector that select either one of a post-signal and a pre-signal, a volume adjusting operator that groups at least a part of the plurality of input channels and collectively adjusts volume levels of the grouped input channels, a mute setting device that sets muting of the grouped input channels, a mute target selector that selects either one of a first mode in which only the post-signal is muted and a second mode in which both pre-signal and post-signal are muted, and a mute controller that controls, when the mute setting device has set muting of the grouped input channels, the volume level controller to execute the muting of the grouped input channels on the first mode, and controls the path disconnector to execute the muting of the grouped input channels on the second mode.

4 Claims, 10 Drawing Sheets

AUDIO SIGNAL PROCESSING APPARATUS MIXING PLURALITY OF INPUT AUDIO SIGNALS

CROSS REFERENCE TO RELATED APPLICATION

This application is based on Japanese Patent Application 2007-058401, filed on Mar. 8, 2007, the entire contents of which are incorporated herein by reference.

BACKGROUND OF THE INVENTION

A) Field of the Invention

This invention relates to an audio signal processing apparatus and more specifically to an audio signal processing apparatus that mixes audio signals input from a plurality of input channels and outputs the mixed audio signals.

B) Description of the Related Art

Normally an audio signal processing apparatus having a plurality of input channels such as a mixer adjusts or sets parameters for each channel. The audio signal processing apparatus has operators for setting parameters for each input channel. For example, the apparatus has various setting operators such as a fader operator for adjusting a volume level, an ON-key for setting on/off of the input channel, a PRE-key for setting whether or not an input signal is output via the fader, etc. A plurality of the setting operators are positioned on a panel surface of the audio signal processing apparatus.

The fader operator is an operator for continuously changing parameters of each input channel and adjusts an input level (volume level) of each input channel. The ON-key is a switch equipped to each input channel and switches connection (ON) and disconnection (OFF) of an output path from each input channel to various buses such as a mixing bus, a stereo bus, etc. This function is generally called an ON/OFF function. The PRE-key is a switch equipped to each input channel and selects an audio signal input to various buses from a pre-signal and a post-signal. The pre-signal is a signal bypassing the fader, that is, a signal before a volume level of which is not adjusted by the fader (pre-fader). The post-signal is a signal via the fader, that is, a signal after a volume level of which has been adjusted by the fader (post-fader).

Generally, as described in the above, parameters of each channel are adjusted and set channel by channel; however, a function in which a plurality of input channels are grouped and parameters of the input channels belonging to one group are adjusted all together has been known. In this specification, a group of input channels in this function is called a digitally controlled amplified (DCA) group. Moreover, a function for adjusting volume levels (input levels) of the grouped input channels all together is called a DCA function in this specification.

For the DCA function, at least a fader operator (DCA fader operator) and a DCA mute key for each DCA group are equipped. The DCA fader is an operator for adjusting input levels of channels in one DCA group all together and able to continuously change the input levels as well as the above-described fader operator for input channel. The DCA mute key is a switch for turning on or off a DCA mute. The DCA mute is a function for instantly declining a value of the DCA fader to minus infinity decibel (−∞dB). "PM5D/PM5D-RH MANUAL", YAMAHA CORPORATION, 2004 discloses the DCA function.

Although both DCA mute function and ON/OFF function of input channels are a function for muting (controlling an output of an input channel not to supplied to various buses), results of executing the functions are slightly different from each other because of their ways to accomplish the muting are different.

The ON/OFF function of input channels switches between connection (ON) and disconnection (OFF) of an output path from input channels to various buses; therefore, both pre-signal and post-signal are muted.

On the other hand, the DCA mute function mutes the post-signal but does not mute the pre-signal. That is, an input channel set of which pre-signal is selected to be output is transmitted to a mix bus even if the DCA mute function is executed. That is because the DCA mute function just sets a fader level of the input channel to "−∞dB", and the pre-signal, bypassing the fader, is not affected by the fader level. In the conventional technique, the DCA function is considered to be a function for collectively controlling fader levels of input channels.

However, the DCA function may have been considered as a function for collectively operating input channels. A user thinking that way tends to misunderstand that the DCA mute can mute all the input channels belonging to one DCA group regardless of the selection of the pre-signal and the post-signal. Therefore, the user may think that an operability of an apparatus is inferior because the pre-signal is not muted by the DCA function, and that type of misunderstanding may lead a mistake in a real time performance.

SUMMARY OF THE INVENTION

It is an object of the present invention to provide an audio signal processing apparatus that does not make a user feel uncomfortable in an operation of the apparatus.

It is another object of the present invention to provide an audio signal processing apparatus that can avoid a mistake in an operation of the apparatus.

According to one aspect of the present invention, there is provided an audio signal processing apparatus, comprising: a plurality of input channels, each for inputting an audio signal; a mix bus that mixes the audio signals input from the plurality of input channels; a volume level controller that controls a volume level of each input channel; a path disconnector that connects or disconnects a path from each input channel to the mix bus; a signal selector that select an audio signal to be input to the mix bus for each input channel from either one of a post-signal going through the volume level controller and a pre-signal bypassing the volume level controller; a volume adjusting operator that groups at least a part of the plurality of input channels and collectively adjusts volume levels of the grouped input channels; a mute setting device that sets muting of the grouped input channels; a mute target selector that selects a mute target for the grouped input channels by selecting either one of a first mode in which only the post-signal is muted and a second mode in which both pre-signal and post-signal are muted; and a mute controller that controls, when the mute setting device has set muting of the grouped input channels, the volume level controller to execute the muting of the grouped input channels on the first mode, and controls the path disconnector to execute the muting of the grouped input channels on the second mode.

According to the present invention, an audio signal processing apparatus that does not make a user feel uncomfortable in an operation of the apparatus can be provided.

Further, according to the present invention, an audio signal processing apparatus that can avoid a mistake in an operation of the apparatus can be provided.

DETAILED DESCRIPTION OF THE PREFERRED EMBODIMENTS

Figure 1:
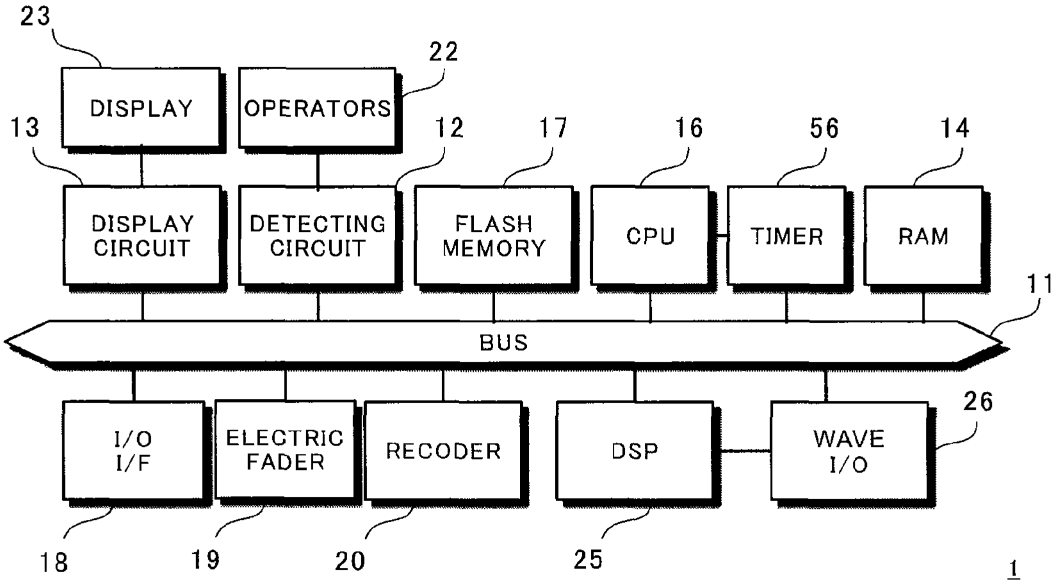
FIG. 1 is a block diagram showing a basic structure of an audio signal processing apparatus (digital mixer) 1 according to an embodiment of the present invention.

FIG. 1 is a block diagram showing a basic structure of an audio signal processing apparatus (digital mixer) 1 according to an embodiment of the present invention.

To a bus 11 are connected a detecting circuit 12, a display circuit 13, a RAM 14, a CPU 16, a flash memory 17, an input/output (I/O) interface 18, a timer 56, a hard disk recorder (HD recorder) 20, a digital sound processor (DSP) 25, a wave input/output (I/O) interface 26 and an electric fader 19.

A user can set a mixing process including setting of equalizing and effects, adjustment of volume levels (input level and output level), assignment of input channels to buses, assignment of the buses to output channels, etc. and input and set various parameters and presets by using a plurality of operators (input devices) 22 connected to the detecting circuit 12. For example, the operators 22 may be a knob, a cursor key, a jog shuttle, a rotary encoder, a slider, a mouse, an alphanumerical keyboard, a musical keyboard, a joy-stick, a switch, etc., which are able to input a signal according to an operation of a user. In this embodiment, a plurality of inputting devices are connected to the detecting circuit 12.

Moreover, in this embodiment, the electric faders 19 are connected to the detecting circuit 12 and to the bus 11 as operators (input devices) for adjusting volume levels (input and output levels). The electric fader 19 continuously changes a parameter assigned to it by a user moving up and down (or left and right) as well as a normal fader. In addition to that, when a user does not move the electric fader 19, i.e., the assigned parameter is changed by setting data, etc., the electric fader 19 can be moved automatically to a position corresponding to a value of the changed parameter by a motor, etc. In this embodiment, fader operators 191 and DCA faders 192 shown in FIG. 2 and fader operators for adjusting output levels (not shown in the drawings) are the electrical faders 19. Moreover, parameters other than a volume level (input or output level) can be assigned to and adjusted by the electric fader 19.

The display circuit 13 is connected to a display 23 and can display assignments of the channels, equalizing for each channel, settings of effects, various adjustments such as an adjustment of a volume level, setting screen of the DCA mute function, etc. The display is configured by including a level meter 232, etc. configured of a liquid crystal display (LCD) 231 (FIG. 2) and a light-emitting diode (LED), etc.

Figure 3:
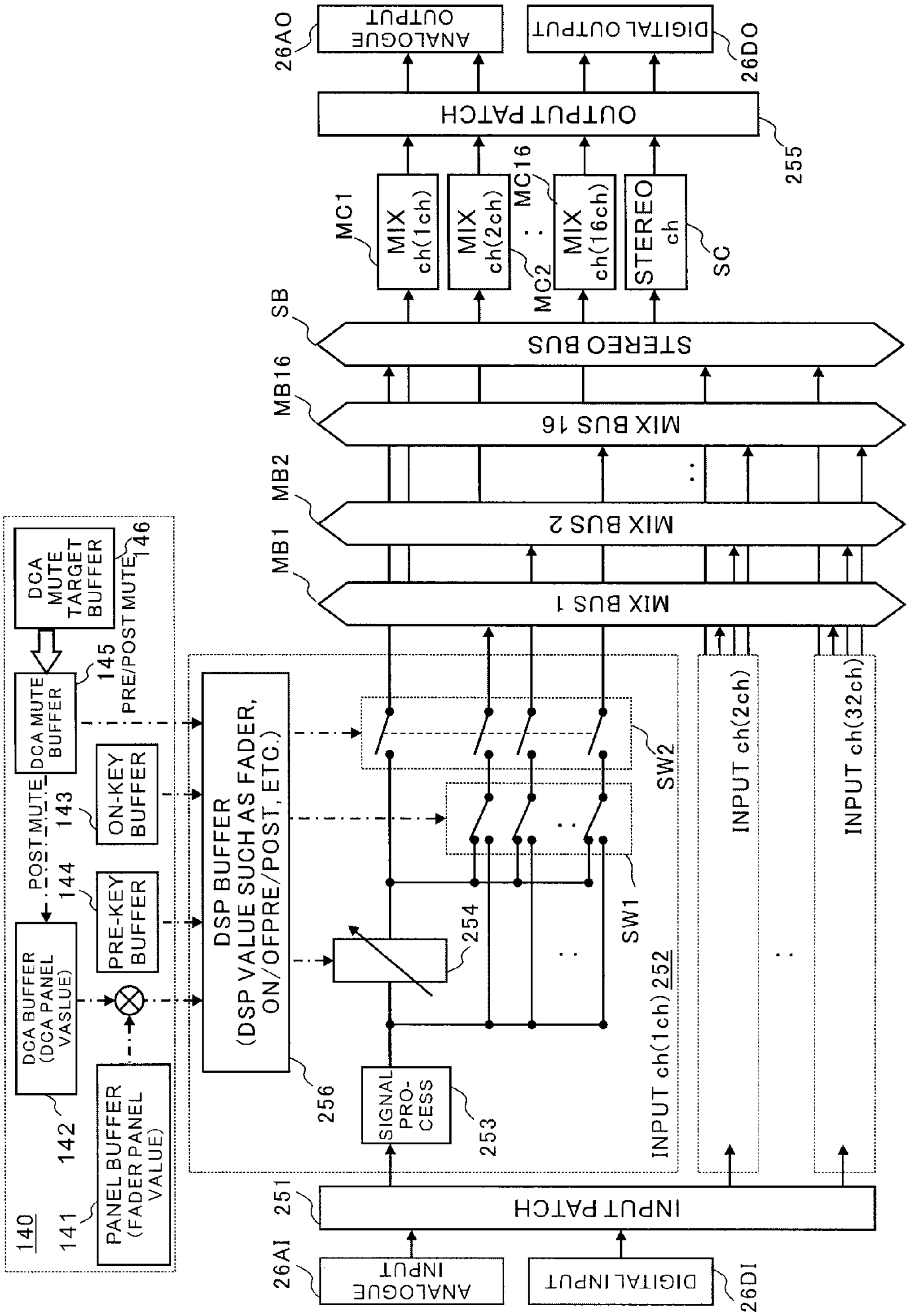
FIG. 3 is a block diagram for explaining functions of a DSP25 in FIG. 1.

The RAM 14 has a working area for the CPU 16 storing a flag, a register or a buffer and various data. In the embodiment of the present invention, a region for a panel buffer 141 and a DCA buffer 142 which are described later with reference to FIG. 3 are prepared in the RAM 14.

The CPU 16 executes calculation or control according to the control program stored in the flash memory 17. The timer 56 is connected to the CPU 16 and the bus 11 and supplies a standard clock signal, an interrupting timing, etc. to the CPU 16. Preset data, various parameters, control programs, etc. can be stored in the flash memory 17.

The I/O interface 18 can connect to an electronic instrument, other audio devices, a computer, an expansion HDD, etc. In this case, the communication interface 18 is composed by using a general interface such as a MIDI interface, a small computer system interface (SCSI), a RS-232C, a universal serial bus (USB), an IEEE1394, etc. In the embodiment of the present invention, the audio signal processing apparatus has a plurality of the I/O interfaces 18.

The HD recorder 20 is composed by a hard disk drive (HDD) and is a recording device that can record audio signals in a digital format to a plurality of tracks simultaneously or to one of the tracks independently, for example, at resolution of 16 bits (or 24 bits) at 44.1 kHz (or 48 kHz).

The DSP25, for example, executes a mixing process including various effects added to analogue or digital audio signals input from the input terminals of the wave I/O interface 26 having a plurality of input terminals (analogue input 26AI, digital input 26DI) and output terminals (analogue output 26AO, digital output 26DO) and the HD recorder 20 and outputs the analogue or digital audio signals from the output terminals. Each input terminal has an AD converter (ADC) that converts analogue audio signals to digital audio signals, and each output terminal has a DA converter (DAC) that converts digital audio signals to analogue signals. Moreover, function of the DSP25 is described with reference to FIG. 3.

Figure 2:
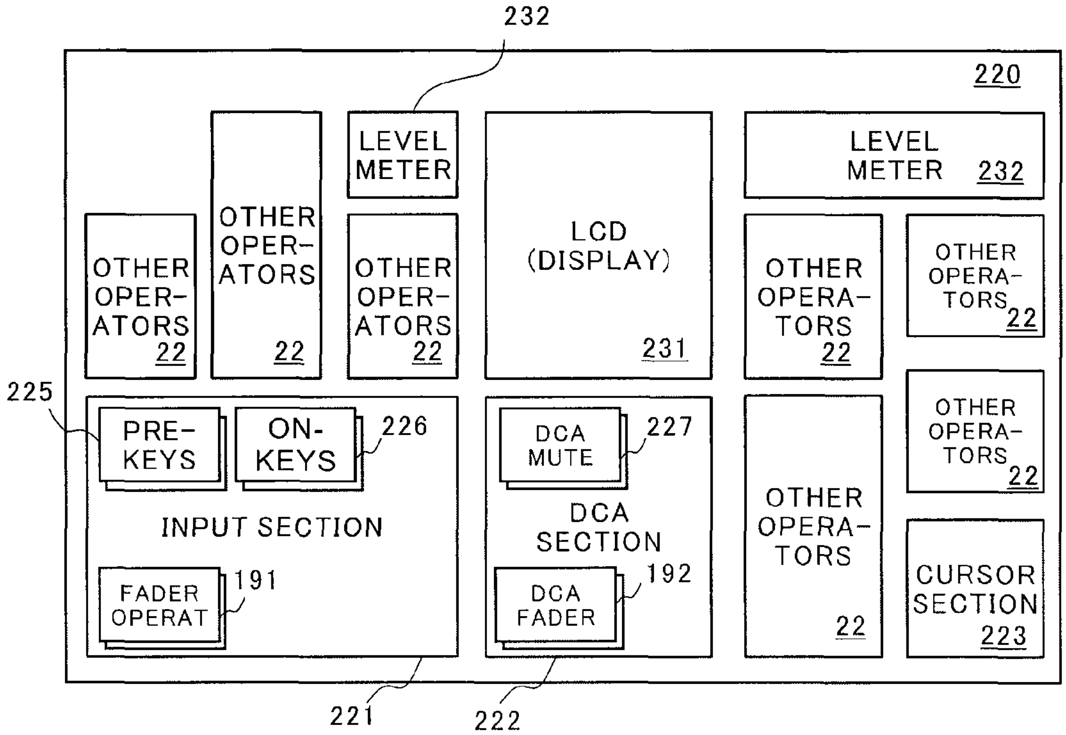
FIG. 2 is a schematic plan view showing a structure of a top panel (operation panel) 220 of the audio signal processing apparatus 1.

FIG. 2 is a schematic plan view showing a structure of a top panel (operation panel) 220 of the audio signal processing apparatus 1.

The top panel 220 has at least an input section 221, a DAC section 222, a cursor section 223, a LCD 231, a level meter 232 and plurality of other operator groups 22.

Operators for adjusting various parameters in the process at the input channels described later are positioned in the input section 221. The input channels have, for example, 4 to 64 channels. In the embodiment of the present invention, 32 channels are equipped. Moreover, the input channels may have any plural numbers of channels. At least a fader operator (input channel fader) 191, a PRE-key 225 and an ON-key 226 are respectively equipped to each input channel in the input section 221. Moreover, the operators equipped in the input section 221 is basically operators for controlling an individual channel independently from other channels.

The fader operator 191 is composed of the electric fader 19 and adjusts an input level (volume parameter) of each input channel individually (independent from other input channels).

The ON-key 226 is a switch (operator) 22 equipped to the input channel and switches connection (ON) and disconnection (OFF) of an output path from each input channel to various buses such as the mixing bus, the stereo bus, etc., individually (independent from other input channels). This function is generally called ON/OFF function.

The PRE-key 225 is a switch (operator) equipped to input channel and selects an audio signal input to various buses from a pre-signal and a post-signal independently (independent from other input channels). The pre-signal (pre-fader) is a signal bypassing the fader, that is, a signal before of a volume level which is not adjusted by the fader. The post-signal (post-fader) is a signal via the fader, that is, a signal after a volume level of which has been adjusted by the fader.

In the DCA section 222, operators for operating the DCA groups are equipped. The DCA group groups a plurality of the input channels and collectively adjusts parameters of the input channels belonging to the group. Moreover, in the embodiment of the present invention, the group of this input channels is called Digitally Controlled Amplified (DCA) group. Moreover, the function for collectively adjusting volume levels (input levels) of the input channels grouped as in the above is called DCA function.

In the DCA section 222, at least a fader operator (DCA fader) 192 for each DCA group and a DCA mute key 227 for each DCA group are equipped. The operators equipped in the DCA section 222 are for collectively operating a plurality of channels belonging to each DCA group.

The DCA fader 192 is an operator for adjusting input levels of the DCA group. As same as the fader operator for the input channel described in the above, the DCA fader 192 is composed by the electric fader 19 in FIG. 1 and can continuously change the input level.

The DCA mute key 227 is a switch (operator) 22 for turning on or off a DCA mute function. The DCA mute is a function for instantly declining a value of the DCA fader to minus infinity decibel (−∞dB) and for lowering the volume level to "0".

The LCD 231 displays necessary information for operating the audio signal processing apparatus 1, and is a display for executing various settings such as setting relating to the whole system or the mixing parameters of the output channels, setting of various effects in the DSP25 and setting of various effects in the output channels. Moreover, setting of the DCA mute target described later is executed by operating the mute target key 234 on a DCA mute target setting screen 233 displayed on this LCD 231 by using a cursor key and an ENTER-key.

In the cursor section 223, plurality of the operators 22 for moving a pointer (an arrow displayed on the screen) and a cursor (a red rectangle showing a selected item) displayed on the LCD 231 and for changing the set value of the parameters are placed.

The level meter 232 is a meter displaying an input level of each input channel, an output level of each mixer channel and other input levels or output levels. Other operator groups 22 are operator groups for executing setting of the output channels, setting of the recorder 20 and setting of the operators positioned in the input section 221.

FIG. 3 is a block diagram for explaining functions of the DSP25 in FIG. 1. The same reference numbers are given to the same structures as those in FIG. 1. The DSP25 is composed of an input patch 251, input channels 252 for 32ch, mix buses MB1 to MB 16 for 16ch, stereo buses SB for 2ch of left and right, mix channels MC1 to MC 16 for 16ch which are the output channels, stereo channels SC for 2ch of left and right and an output patch 255.

The input patch 251 selectively connects plurality of audio signals input from the analogue input 26AI and the digital input 26DI to plurality of the input channels 252. That is, each terminal of the analogue input 26AI and the digital input 26DI is assigned to either one of the input channels 252 for 32ch.

The analogue input 26AI is an input terminal (input port), for example, to input analogue audio signals (a microphone input, a line input, etc.) for 1 to 32ch via the ADC. The digital input 26DI is an input terminal (input port), for example, to input digital audio signals (digital output from the digital device such as a digital MTR, a hard disk recorder, etc.) for 1 to 32ch. Moreover, the analogue input 26AI has the ADC for converting the input analogue audio signals into digital audio signals.

The input channels 252 execute selection of attenuator (attenuation/amplification), a compressor, an equalizer, the fader (adjustment of a volume level), pan and path of the signal (pre-signal and post-signal) to be transmitted to the bus, and various signal processes such as connection (ON) and disconnection (OFF) of the signal to be transmitted to the bus, the send level, etc. Then, the input channels 252 output the processed audio signals to the mix buses MB1 to MB16 and the stereo buses.

Each input channel 252 includes a signal processing unit 253, a volume control unit (fader) 254, a pre/post switch control unit (switch) SW1, an ON/OFF switch control unit (switch) SW2 and a DSP buffer 256.

The signal processing unit 253 adds various effects such as attenuator (attenuation/amplification), the compressor, equalizing, etc. to the audio signal input from the input patch 251. The audio signal processed at the signal processing unit 253 is transmitted to an input terminal (input terminal on a lower part in the diagram) that is one end of the fader 254 and the switch SW1.

The fader 254 adjusts the volume level (input level) of the audio signals input from the signal processing unit 253 based on the fader DSP value kept in the DSP buffer 256. In the embodiment of the present invention, the volume level is adjusted by outputting the input audio signal at an output ratio represented at the fader DSP value because the fader DSP value is kept as plus (+) or minus (−) decibel (dB) value. The audio signal of which volume level has been adjusted in the above is transmitted to other input terminal (input terminal at upper part of the diagram) of the switch SW1 in a rear column and the SW2.

The switch SW1 switches a path from the signal processing unit 253 of the audio signal to the switch SW2 based on the pre/post value kept in the DSP buffer 256. Specifically, when the pre/post DSP value is corresponding to the "pre-signal" (hereinafter; it will be just described by that the pre/post DSP value is the "pre-signal"), the audio signal output from the signal processing unit 253 is input to the switch SW2 bypassing (without passing through) the fader 254 by connecting the input terminal (input terminal lower in the diagram) at the above-described one side with the input terminal of the SW2. Moreover, when the pre/post DSP value is corresponding to the "post-signal" (hereinafter; it will be just described that the pre/post DSP value is the "post-signal"), the audio signal output from the signal processing unit 253 is input to the switch SW2 via the fader 254 by connecting the input terminal (input terminal upper in the diagram) at the above-described other side to the input terminal of the SW2.

The switch SW2 switches connection (ON) and disconnection (OFF) of the path to the buses MB1 to MB16 of the audio signal and SB based on the ON/OFF DSP value kept in the DSP buffer 256. Specifically, when the ON/OFF DSP value is corresponding to "ON" (hereinafter, it will be just described that the ON/OFF DSP value is "ON".), the audio signals input from the switch SW1 (the fader 254 in case of inputting to the stereo bus SB) is input to the buses MB1 to MB16 or the SB by connecting the input terminal to the output terminal. Moreover, when the ON/OFF DSP value is corresponding to "OFF" (hereinafter, it will be just described that the ON/OFF DSP value is "OFF".), input of the audio signals of the input channel is stopped to mute by disconnecting the input terminal from the output terminal.

The DSP buffer 256 keeps a value (DSP value) of the parameters actually to be set to each control unit in the DSP25 based on the panel value kept in the panel buffer 140. The DSP value is a value to be set for each control unit in the DSP25 and is kept by control unit.

The panel buffer 140 is a buffer for keeping the panel value, for example, is equipped by the parameter type that can be set with each operator in the RAM 14 or the flash memory 17 in FIG. 1. The panel buffer 140 is, for example, an input channel fader panel buffer 141, a DCA fader panel buffer (DCA buffer) 142, an on-key panel buffer 143, a PRE-key panel buffer 144, a DCA mute panel buffer 145, a DCA mute target panel buffer 146, etc.

In the embodiment of the present invention, the "panel value" is a parameter value set by various operators of 19 and 22 positioned on the top panel 220, a value currently represented by the operators and a value displayed on the LCD231. Moreover, the panel value is just a present set value of each of operators 19 and 22 and different from the DSP value actually set for the DSP25. That is, the panel value will not directly affect to the setting of the DSP25, and the panel value affects the setting for the first time by rewriting the DSP value based on the panel value.

The fader panel buffer 141 is a buffer for keeping the panel value (fader panel value) of the fader operator (input channel fader) 191 positioned in the input section 221 (FIG. 2) by each input channel 252. The fader panel value is provided to the DSP buffer 256 if necessary, and the fader panel buffer 141 overwrites the corresponding DSP value (the fader value of the input channel 252).

The DCA buffer (DCA fader panel buffer) 142 is a buffer for keeping the present set value (DCA fader panel value) of the DCA fader 192 positioned in the DCA section 222, and the DCA fader panel value is provided to the DSP buffer 256 after multiplied with the input channel fader panel value if necessary and overwrites the corresponding DSP value (fader DSP value of the input channel 252 belonging to the DCA group).

The ON-key panel buffer 143 is a buffer for keeping the panel value of the ON-key 226 in FIG. 2 for the input channel 252. The panel value (ON-key panel value) of the ON-key is overwritten to the value (hereinafter, just described that "the ON-key panel value is "ON" or "OFF") corresponding to either "ON" or "OFF" corresponding to the operation of the ON-key 226 by the user. The ON-key panel value is provided to the DSP buffer 256 depending on necessity and overwrites the corresponding DSP value (the ON/OFF DSP value of the input channel 252).

The PRE-key panel buffer 144 is a buffer for keeping the panel value of the PRE-key 225 in FIG. 2 for the input channel 252. The panel value (PRE-key panel value) of the PRE-key 225 is overwritten to the value (hereinafter, just described that "the PRE-key panel value is "pre-signal" or "post-signal") corresponding to either "pre" (pre-signal) or "post" (post-signal) corresponding to the operation of the ON-key 226 by the user. The PRE-key panel value is provided to the DSP buffer 256 depending on necessity and overwrites the corresponding DSP value (the pre/post DSP value of the input channel 252).

The DCA mute buffer 145 is a buffer for keeping the panel value (DCA panel value) of the DCA mute 227 in FIG. 2 for the DCA group. The DCA mute panel value is overwritten to the value corresponding to either "ON" or "OFF" (hereinafter, just described as "ON" or "OFF") in accordance with the operation of the DCA mute 227 by the user. When the DCA mute panel value is "ON", the value of the DCA fader (DCA panel value) is instantly declined to $-\infty$dB in case that the DCA mute target described later is "post mute" (mute only the post-signal). Moreover, when the DCA mute panel value is "ON", the ON/OFF DSP values of all the input channel 252 belonging to the DCA group are overwritten to the value corresponding to "OFF" in case that the DCA mute target is "pre/post mute (mute both of the pre-signal and the post-signal).

The DCA mute target panel buffer 146 is a buffer for keeping the panel value (DCA mute target panel value) of a mute target key 234 in a DCA mute target setting screen 232 displayed on the LCD 231. Details are described later with reference to FIG. 4.

The mix buses MB1 to MB16 and the stereo bus SB mix plurality of the audio signals to be input to each bus and output to the output channels (mixing channels MC1 to MC16 and the stereo channel SC for 2ch of left and right) corresponding to each bus.

The output channels (the mix channels MC1 to MC16 and the stereo channel SC for 2ch of left and right) execute various signal processes such as compressor, equalizing, fader (volume adjustment) to the audio signals to be input to each channel and output the processed audio signals to the output patch 255.

The output patch 255 selectively connects the audio signal output from each of the mix channels MC1 to MC16 and the stereo channel SC for 2ch of left and right to plurality of output ports (the analogue output 26AO and the digital output 26DO). That is, each of the mix channels MC1 to MC16 and the stereo channel SC for 2ch of left and right is assigned to either analogue output 26AO or the digital output 26 DO.

The analogue output 26AO is, for example, an output terminal (output port) to output the audio signals for 1ch to 16ch or the stereo for 2ch with analogue format.

Figure 4A:
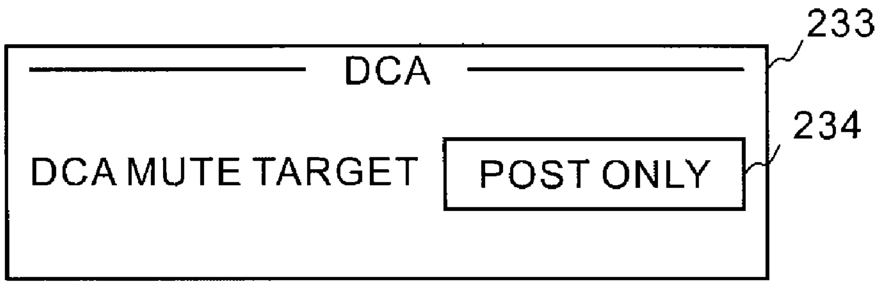
FIG. 4A and FIG. 4B are schematic plan views showing examples of a DCA mute target setting screen 233 displayed on an LCD 231 in FIG. 2.
Figure 4B:
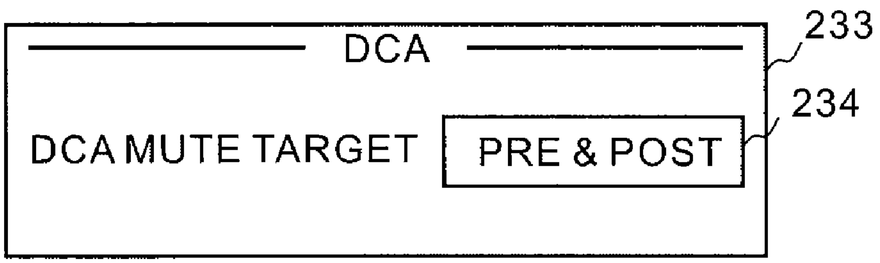

FIG. 4A and FIG. 4B are schematic plan views showing examples of a DCA mute target setting screen 233 displayed on an LCD 231 in FIG. 2.

A user operates (changes) the mute target key 234 in the DCA mute target setting screen 233 displayed on the LCD 231 by using the cursor key and the ENTER key equipped in the cursor section in FIG. 2 in a DCA mute target setting process described later with reference to FIG. 5. In a state shown in FIG. 4A, The "post-signal" is selected as a DCA mute target, and the DCA mute target panel value of the DCA mute target panel buffer 146 in FIG. 3 is "post mute" at this time. For example, when the user operates (changes) the mute target key 234 by using the cursor key and the ENTER key in the state shown in FIG. 4A, the state becomes a state shown in FIG. 4B, and the "pre-signal and post-signal" is selected as the DCA mute target. In this case, the DCA mute target panel value of the DCA mute target panel buffer 146 is changed from the "post mute" to the "pre/post mute" (hereinafter, just called the "post mute" or the "pre/post mute"). The "post mute" is a mode to target only the post-signal as the DCA mute process target (DCA mute target) of the DCA mute. Moreover, the "pre/post mute" is a mode to target both of the pre-signal and the post-signal as the DCA mute process target (DCA mute target) of the DCA mute.

Figure 5:
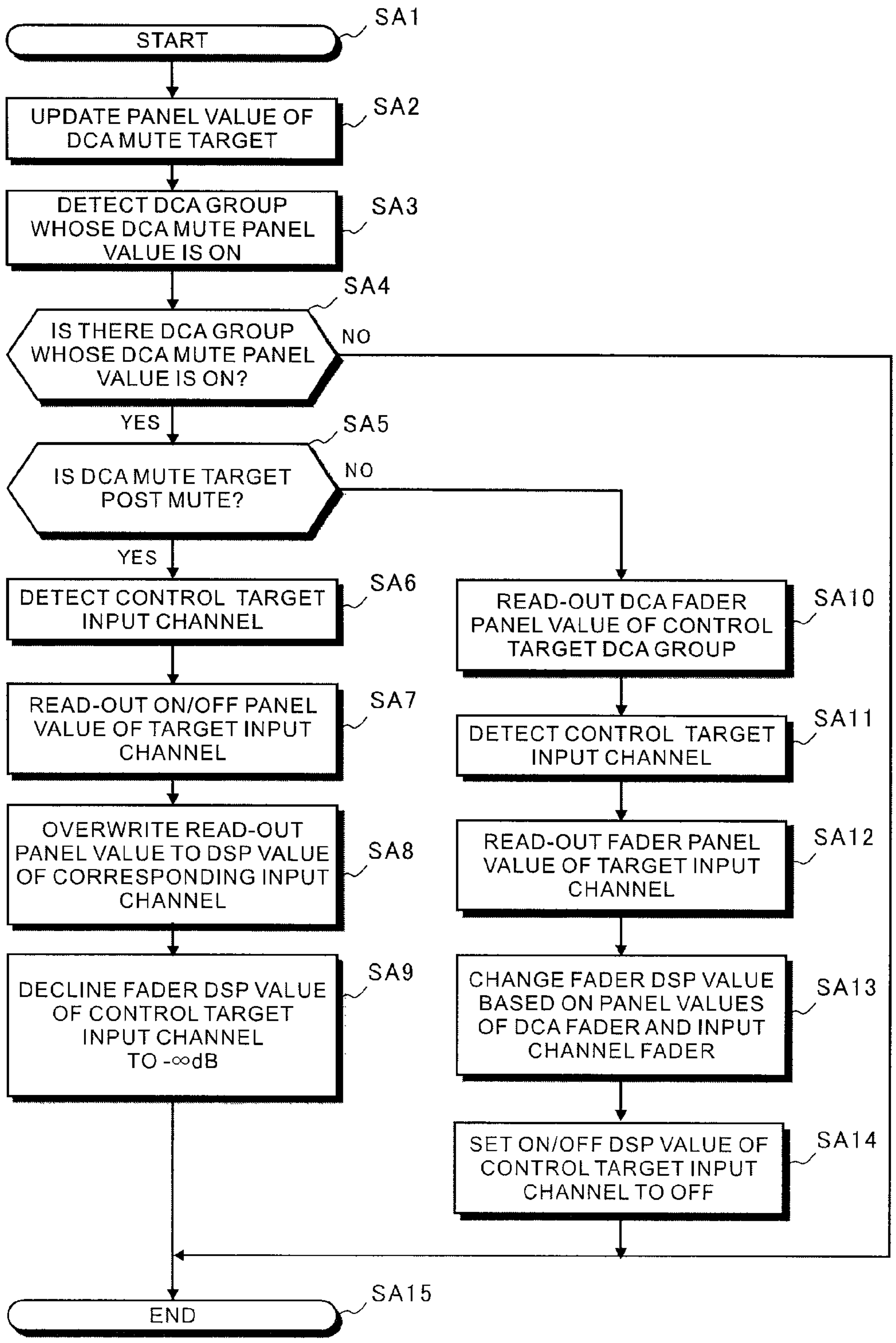
FIG. 5 is a flow chart showing a DCA mute target setting process according to the embodiment of the present invention.

FIG. 5 is a flow chart showing a DCA mute target setting process according to the embodiment of the present invention. This process is started, for example as shown in FIG. 4, when an instruction to change the DCA mute target panel value of the DCA mute target panel buffer 146 in FIG. 3 is detected by operating (changing) the mute target key 234 on the DCA mute target setting screen 233 by using the cursor key and the ENTER key. This process is, for example, controlled by the CPU 16 in FIG. 1.

This process collectively controls a plurality of channels belonging to a DCA group. Therefore, the input channels 252 to be control targets to be detected at Step SA6 and Step SA11 described later are naturally plural. Moreover, processes from Steps SA7 to SA8 and SA12 to SA14 are executed to each of plurality of the detected channels.

At Step SA1, the DCA mute target setting process starts. At Step SA2, the panel value of the DCA mute target is updated. According to a result of operation to the mute target key 234 on the DCA mute target setting screen 233 that starts this process, the DCA mute target panel value of the DCA mute target panel buffer 146 in FIG. 3 is updated from the "post-mute" to the "pre/post-mute" or from the "pre/post-mute" to the "post-mute".

At Step SA3, it is detected whether there is a DCA group that the panel value of the DCA mute is "ON" or not. At this step, the DCA mute panel values in the DCA mute key panel buffer 145 (FIG. 3) of all the DCA groups are referred, and the DCA group/groups of which the panel value is "ON" is/are extracted. Then, at Step SA4, the extraction result at Step SA3 is referred, and it is judged whether there is a DCA group of which the panel value of the DCA mute is "ON" or not. When there is a DCA group of which the panel value of the DCA mute is "ON", the process proceeds to Step SA 5 as indicated with an arrow "YES". When there is no DCA group of which the panel value of the DCA mute is "ON", the process proceeds to Step SA15 as indicated with an arrow "NO", and the DCA mute target setting process finishes.

At Step SA5, it is judged whether the panel value of the DCA mute target is "post-mute" or not. That is, the panel value that is newly set is detected. When the new panel value is "post-mute", the process proceeds to Step SA6 as indicated with an arrow "YES". When the new panel value is "pre/post-mute", the process proceeds to Step SA10 as indicated with an arrow "NO".

At Step SA6, the input channels 252 to be the control targets of the DCA mute function are detected. That is, the input channels 252 belonging to the DCA group extracted at Step SA3 and to be muted by the DCA mute function are extracted. When plurality of the DCA groups are extracted, the input channels belonging to the groups are extracted for all the extracted DCA groups. Moreover, the input channels 252 belonging to each DCA group are kept as, for example, the panel value of the DCA group in the panel buffer 140 in FIG. 3, and extraction of the input channels is executed with reference to the panel value.

At Step SA7, the ON-key panel value of the input channel 252 to be the control target extracted at Step SA6 is obtained with reference to the ON-key panel buffer 143 in FIG. 3. Then, at Step SA8, the ON-key panel value obtained at Step SA7 is overwritten to the ON/OFF DSP value of the input channel 252 to be the control target extracted at corresponded Step SA6 in the DSP buffer 256.

As described in the above, the On/OFF DSP value is overwritten with the obtained panel value, and the DCA mute (pre/post-mute) by the ON/OFF switch SW2 in FIG. 3 is released by changing the state of the DSP25 in accordance with the DSP value after updating the DCA mute target key.

At Step SA9, the fader DSP value of the input channel 252 to be the control target extracted at Step SA6 is declined to −∞dB, and the volume is made to be "0". "−∞dB" is written to the fader DSP value, and the DCA mute (post-mute) by the fader 254 in FIG. 3 is set by changing the state of the DSP25 in accordance with the DSP value after updating the DCA mute target key. Then, the process proceeds to Step SA15, and the DCA mute target setting process finishes.

At Step SA10, the DCA fader panel value kept in the DCA fader panel buffer 142 (FIG. 3) of the DCA fader 192 (FIG. 2) of the DCA group extracted at Step SA3 is obtained. When plurality of the DCA groups are extracted at Step SA3, the DCA fader panel values for all the DCA groups are obtained.

At Step SA11, as same as Step SA6 described in the above, the input channels 252 to be the control targets of the DCA mute function are detected.

At Step SA12, the fader panel value of the input channel 252 to be the control target extracted at Step SA11 is obtained with reference to the input channel fader panel buffer 141 in FIG. 3.

At Step SA13, the DSP value of the fader 254 is changed based on the panel value of the DCA fader 192 obtained at Step SA11 and the panel value of the input channel fader 191 of the input channel 252 obtained at Step SA12. At this step, the panel value of the DCA fader 192 obtained at Step SA11 and the panel value of the input channel fader 191 of the input channel 252 obtained at Step SA12 are multiplied, and the DSP value of the fader 254 is calculated for each input channel to be the control target extracted at Step SA10, and the fader DSP value of the input channel with the DSP value calculated as described in the above is overwritten. The DCA mute (post-mute) according to the fader 254 in FIG. 3 is released by changing the state of the DSP25 in accordance with the DSP value after updating the DCA mute target key.

At Step SA14, the ON/OFF DSP values in the DSP buffer 256 for all of the input channels 252 to be the control targets extracted at Step SA11 are turned off. As described in the above, the DCA mute (pre/post-mute) according to the ON/OFF switch SW2 in FIG. 3 is set by changing the state of the DSP25 in accordance with the DSP value after updating the DCA mute target key. Then, the process proceeds to Step SA15 to finish the DCA target mute target setting process.

Figure 6:
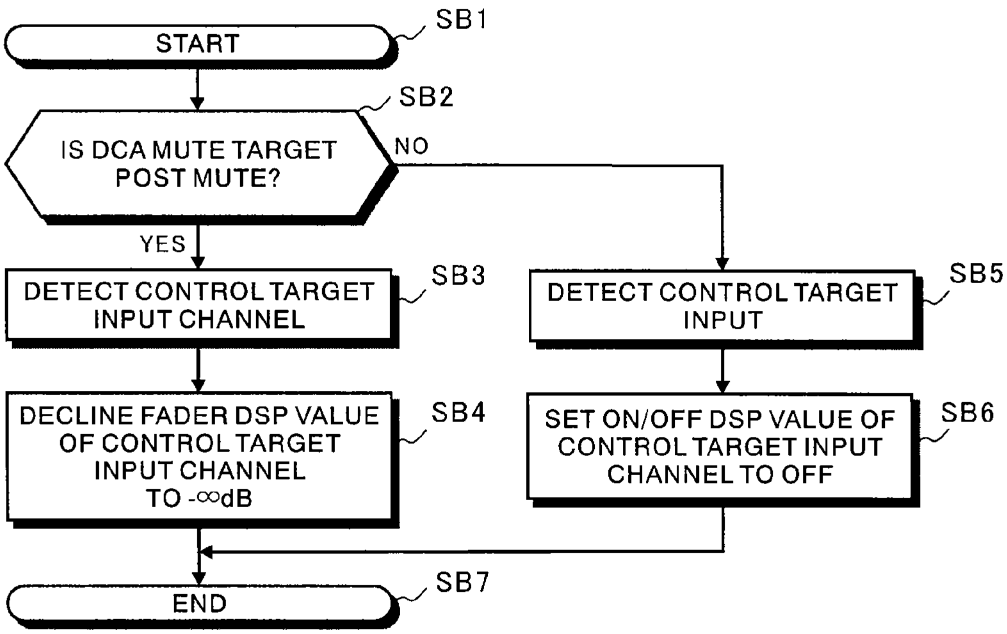
FIG. 6 is a flow chart showing a DCA mute setting process according to the embodiment of the present invention.

FIG. 6 is a flow chart showing a DCA mute setting process according to the embodiment of the present invention. This process is, for example, the process which is started when the instruction to turn on the DCA mute panel value of the DCA mute panel buffer 145 in FIG. 3 by operating the DCA mute 227 in FIG. 2 by the user is detected. This process is, for example, controlled by the CPU 16 in FIG. 1.

Moreover, this process is executed only for one DCA group corresponding to the DCA mute 227 operated by the user as the process target. Moreover, plurality of the channels belonging to the DCA group are collectively controlled. Therefore, the input channels to be the control targets and detected at Step SB3 and Step SB5 described later are naturally plural. Moreover, processes of Step SB4 and Step SB6 are executed to each of plurality of the detected channels.

At Step SB1, the DCA mute setting process starts, and at Step SB2, it is judged whether the panel value of the DCA mute target is "post-mute" or not. When the panel value is "post-mute", the process proceeds to Step SB3 as indicated with an arrow "YES". When the panel value is "pre/post-mute", the process proceeds to Step SB5 as indicated with an arrow "NO".

At Step SB3, the input channel 252 to be a control target of the DCA mute function is detected. That is, the input channel 252 belonging to the DCA group corresponding to the DCA mute 227 in FIG. 2 that starts this process to be muted by the DCA mute function is extracted. Moreover, the input channel 252 belonging to each DCA group is kept as, for example, the panel value of the DCA group in the panel buffer 140 in FIG. 3, and the extraction of the input channel is executed with reference to the panel value.

At Step SB4, the fader DSP value of the input channel 252 to be the control target extracted at Step SB3 is declined to −∞dB, and the volume is made to be "0". As described in the above, the channel (the channel of which the pre/post-DSP value is "post-signal") of which the post-signal is selected is muted. Moreover, the channel (the channel of which the pre/post-DSP value is "pre-signal") of which the pre-signal is selected is not muted. Then, the process proceeds to Step SB7, and the DCA mute setting process finishes.

At Step SB5, as same as Step SB3 described in the above, the input channel to be the control target of the DCA mute function is detected.

At Step SB6, the ON/OFF DSP values in the DSP buffer 256 for all of the input channels 252 to be the control targets extracted at Step SB5 are turned off. As described in the above, all the input channels belonging to the DCA group are muted regardless of the pre/post DSP value by turning off the ON/OFF DSP value. Then, the process proceeds to Step SB7 to finish the DCA mute setting process.

Figure 7:
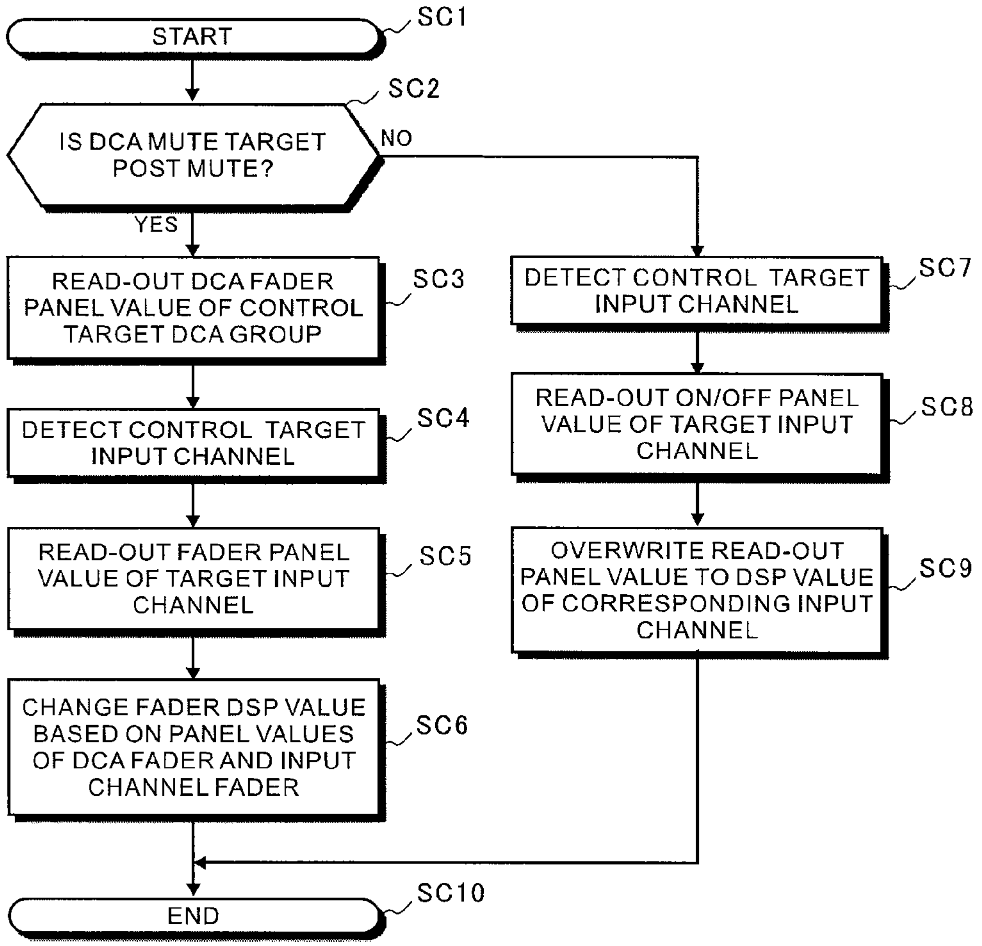
FIG. 7 is a flow chart showing a DCA mute target releasing process according to the embodiment of the present invention.

FIG. 7 is a flow chart showing a DCA mute target releasing process according to the embodiment of the present invention. This process is, for example, the process which is started when the instruction to turn off the DCA mute panel value of the DCA mute panel buffer 145 in FIG. 3 by operating the DCA mute 227 in FIG. 2 by the user is detected. This process is, for example, controlled by the CPU 16 in FIG. 1.

Moreover, this process is executed only for one DCA group corresponding to the DCA mute 227 operated by the user as the process target. Moreover, plurality of the channels belonging to the DCA group are collectively controlled. Therefore, the input channels to be the control targets to examine at Step SC4 and Step SC7 described later are naturally plural. Moreover, processes of Steps SC5, SC6, SC8 and SC9 are executed to each of plurality of the detected channels.

At Step SC1, the DCA mute releasing process starts. At Step SC2, it is judged whether the panel value of the DCA mute target is "post-mute" or not. When the panel value is "post-mute", the process proceeds to Step SC3 as indicated with an arrow "YES". When the panel value is "pre/post-mute", the process proceeds to Step SC7 as indicated with an arrow "NO".

At Step SC3, the DCA fader panel value kept in the DCA fader panel buffer 142 (FIG. 3) of the DCA fader 192 (FIG. 2) of the DCA group corresponding to the DCA mute 227 in FIG. 2 that starts this process is obtained to mute according to the DCA mute function.

At Step SC4, as same as Step SB3 in FIG. 6 described in the above, the input channel 252 to be the control target of the DCA mute function is detected.

At Step SC5, the fader panel value of the input channel 252 to be the control target extracted at Step SC4 is obtained with reference to the input channel fader panel buffer 141 in FIG. 3.

At Step SC6, the DSP value of the fader 254 is changed based on the panel value of the DCA fader 192 obtained at Step SC3 and the panel value of the input channel fader 191 of the input channel 252 obtained at Step SC5. This process is the same process as Step SA13 in FIG. 5 described in the above; however, the DCA mute according to the post-mute mode is released (reproduction is restarted) by this process. Then, the process proceeds to Step SC10 to finish the DCA mute releasing process.

At Step SC7, the input channel 252 to be the control target of the DCA mute function is detected. That is, the input channel 252 belonging to the DCA group corresponding to the DCA mute 227 in FIG. 2 that starts this process to be muted by the DCA mute function is extracted. Moreover, the input channel 252 belonging to each DCA group is kept as, for example, the panel value of the DCA group in the panel buffer 140 in FIG. 3, and the extraction of the input channel is executed with reference to the panel value.

At Step SC8, the ON-key panel value of the input channel 252 to be the control target extracted at Step SC7 is obtained with reference to the ON-key panel buffer 143 in FIG. 3. Then, at Step SC9, the ON-key panel value obtained at Step SC8 is overwritten to the ON/OFF DSP value of the input channel 252 to be the control target extracted at the corresponded Step SC7 in the DSP buffer 256. The DCA mute according to the pre/post-mute mode is released (reproduction is restarted) by this process. Since the ON/OFF DSP value is overwritten with the obtained panel value, the input channel keeps the muted state in case mute (off) is set by the ON-key 226 FIG. 2 by each input channel. Then the process proceeds to Step SC1 to finish the DCA mute releasing process.

Figure 8:
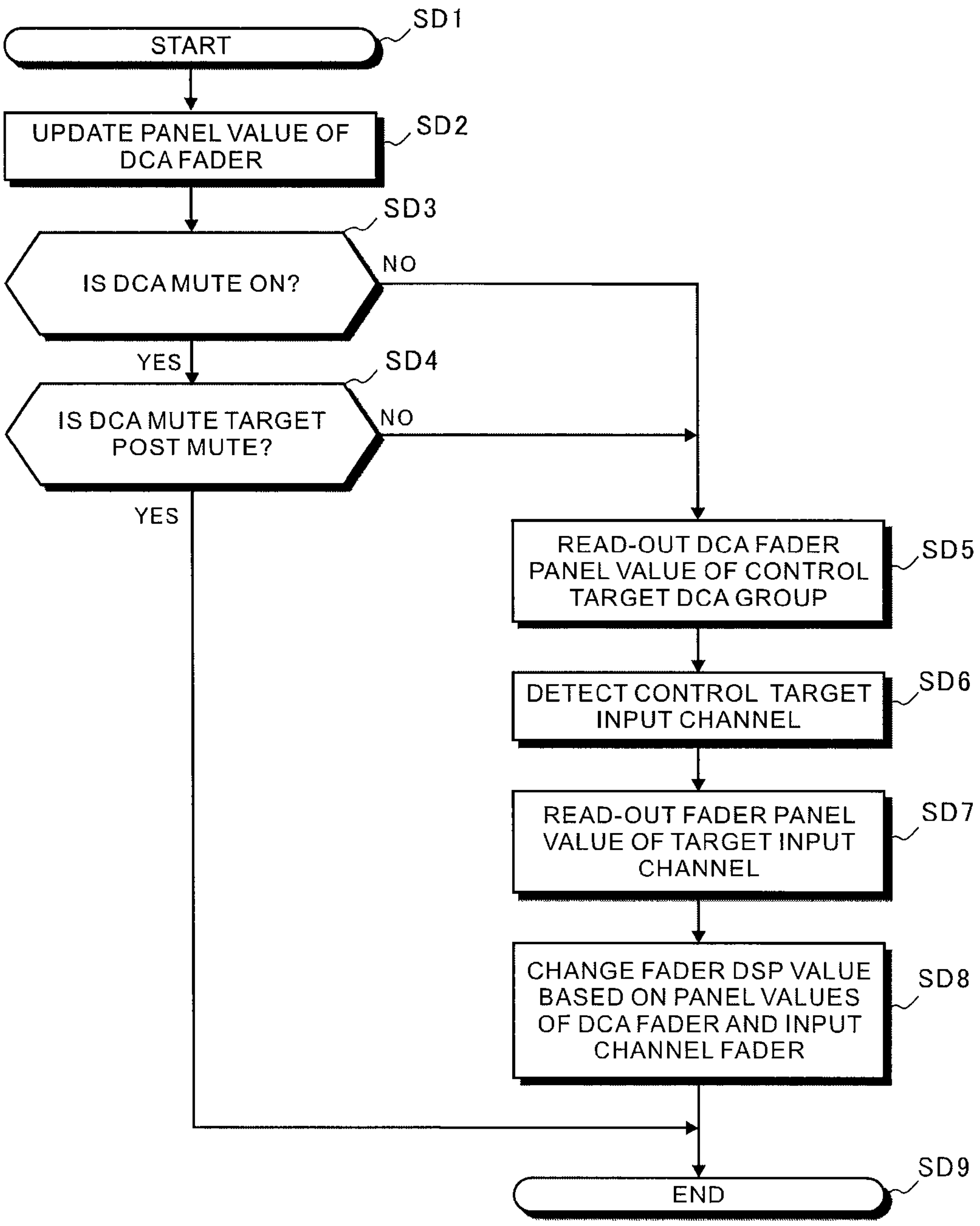
FIG. 8 is a flow chart showing a DCA fader process according to the embodiment of the present invention.

FIG. 8 is a flow chart showing a DCA fader process according to the embodiment of the present invention. This process is, for example, the process which is started when the instruction to change the DCA fader panel value of the DCA fader panel buffer 142 in FIG. 3 by operating the DCA fader 192 in FIG. 2 by the user is detected. This process is, for example, controlled by the CPU 16 in FIG. 1.

Moreover, this process is executed only for one DCA group corresponding to the DCA fader 192 operated by the user as the process target. Moreover, plurality of the channels belonging to the DCA group are collectively controlled. Therefore, the input channels to be the control targets to examine at Step SD6 described later are naturally plural. Moreover, processes of Step SD7 and Step SD8 are executed to each of plurality of the detected channels.

At Step SD1, the DCA fader process starts. At Step SD2, the DCA fader panel value of the DCA fader panel buffer 142 in FIG. 3 is overwritten with a new value in consideration of an amount of an operation corresponding to the operation of the DCA fader 192 that starts this process. The new value in consideration of the amount of the operation is, for example, a value added with or subtracted by the parameter value (panel value) corresponding to an absolute position of the fader 192 after completing the operation and the parameter value corresponding to a relative moving amount of the fader 192 in the operation to the prior panel value.

At Step SD3, it is judged whether the DCA mute of the DCA group to be the process target is "ON" or not. For example, it is detected by obtaining the DCA mute panel value kept in the DCA mute panel buffer 145 (FIG. 3) of the DCA mute (FIG. 2) of the DCA group (DCA group to be the process target) corresponding to the DCA fader 192 in FIG. 2 that starts this process. When the DCA mute is "ON", the process proceeds to Step SD4 as indicated with an arrow "YES". When the DCA mute is "OFF", the process proceeds to Step SD5 as indicated with an arrow "NO".

At Step SD4, it is judged whether the panel value of the DCA mute target is "post-mute" or not. When the panel value is "post-mute", the process proceeds to Step SD9 as indicated with an arrow "YES" to finish the DCA fader process. When the panel value is "pre/post-mute", the process proceeds to Step SD5 as indicated with an arrow "NO".

The DCA fader process finishes when the panel value is "post-mute" because the fader DSP value is set to −∞dB to mute in the post-mute mode and the mute function is released when the fader DSP value is changed. Therefore, the panel value newly set at Step SD2 cannot reflect on the DSP value, and this process finishes at this time.

When the panel value is "pre/post-mute", the muted state is not reflected if the fader DSP value is changed because the ON/OFF DSP value is set to "OFF" to mute. Therefore, the panel value newly set at Step SD2 is reflected on the DSP value.

At Step SD5, as same as Step SC3 in FIG. 7 described in the above, the DCA fader panel value kept in the DCA fader panel buffer 142 (FIG. 3) of the DCA fader 192 (FIG. 2) of the DCA group to be the process target is obtained.

At Step SD6, as same as Step SB3 in FIG. 6 or Step SC4 in FIG. 7 described in the above, the input channel 252 to be the control target of the DCA mute function is detected.

At Step SD7, as same as Step SC5 in FIG. 7 described in the above, the fader panel value of the input channel 252 to be the control target extracted at Step SD6 is obtained with reference to the input channel fader panel buffer 141 in FIG. 3.

At Step SD8, the DSP value of the fader 254 is changed based on the panel value of the DCA fader 192 obtained at Step SD5 and the panel value of the input channel fader 191 of the input channel 252 obtained at Step SD7. This is the same process as Step SA13 in FIG. 5 or Step SC6 in FIG. 7 described in the above; however, the panel value newly set at Step SD2 is just reflected on the DSP value, and the state of the DCA mute is not changed. Then, the process proceeds to Step SD9 to finish the DCA fader process.

Figure 9:
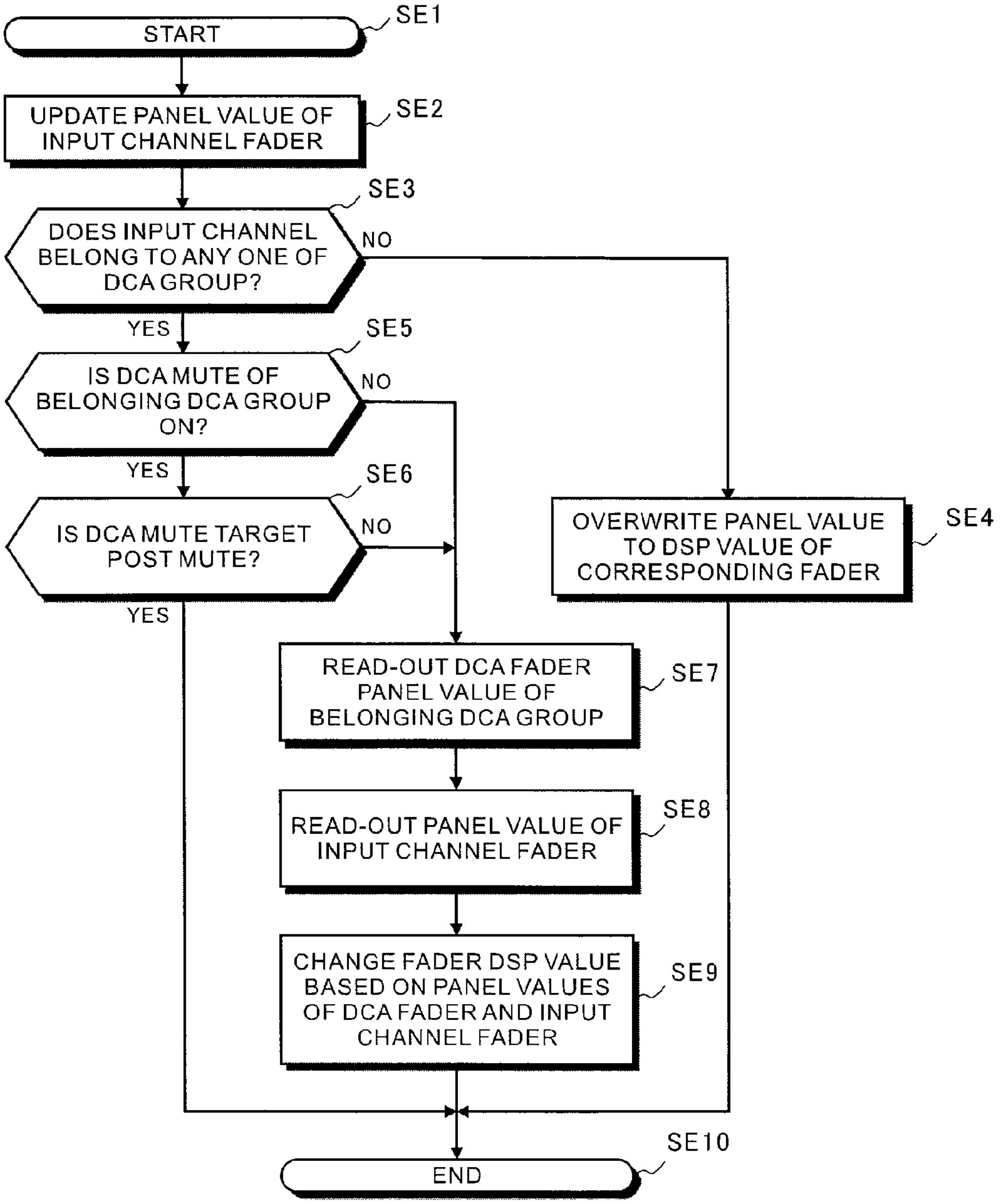
FIG. 9 is a flow chart showing an input channel fader process according to the embodiment of the present invention.

FIG. 9 is a flow chart showing an input channel fader process according to the embodiment of the present invention. This process is, for example, the process which is started when the instruction to change the fader panel value of the input channel fader panel buffer 141 in FIG. 3 by operating the input channel fader 191 in FIG. 2 by the user is detected. This process is, for example, controlled by the CPU 16 in FIG. 1. Moreover, this process is executed only for one input channel 252 corresponding to the input channel fader 191 operated by the user as the process target.

At Step SE1, the input channel fader process starts. At Step SE2, the input channel fader panel value of the input channel fader panel buffer 141 in FIG. 3 is overwritten with a new value in consideration of an amount of the operation corresponding to the operation of the input channel fader 191 that starts this process. The new value in consideration of the amount of the operation is, for example, a value added with or subtracted by the parameter value (panel value) corresponding to the absolute position of the fader 191 after completing the operation and the parameter value corresponding to a relative moving amount of the fader 191 in the operation to the prior panel value.

At Step SE3, it is judged whether the input channel (process target input channel) corresponding to the operated input channel fader 191 belongs to one of any DCA groups. At this process, the DCA group to which the process target input channel belongs is extracted with reference to the panel value of each DCA group. When the process target input channel does not belong to any one of the DCA groups, the process proceeds to Step SE4 as indicated with an arrow "NO". When the process target input channel belongs to any one of the DCA groups, the process proceeds to Step SE5 as indicated with an arrow "YES".

At Step SE4, the fader DSP value in the DSP buffer 256 of the process target input channel is overwritten with the input channel fader panel value updated at Step SE2. The panel value of the input channel fader to be the process target is overwritten to the fader DSP of the input channel, and the state of the DSP25 is changed in accordance with the DSP value after updating.

At Step SE5, it is detected whether the DCA mute of the DCA group (the corresponding DCA group) to which the process target input channel belongs is "ON" or not. For example, it is detected by obtaining the DCA mute panel value kept in the DCA mute panel buffer 145 (FIG. 3) of the DCA mute (FIG. 2) of the corresponding DCA group. When the DCA mute is "ON", the process proceeds to Step SE6 as indicated with an arrow "YES". When the DCA mute is "OFF", the process proceeds to Step SE7 as indicated with an arrow "NO". When there is plurality of the corresponding DCA groups, this process is executed for all of the DCA groups.

At Step SE6, it is judged whether the panel value of the DCA mute target is "post-mute" or not. When the panel value is "post-mute", the process proceeds to Step SE10 as indicated with an arrow "YES" to finish the input channel fader process. When the panel value is "pre/post-mute", the process proceeds to Step SE7 as indicated with an arrow "NO".

The input channel fader process finishes when the panel value is "post-mute" because the fader DSP value is set to −∞dB to mute in the post-mute mode and the mute function is released when the fader DSP value is changed. Therefore, the panel value newly set at Step SE2 cannot reflect on the DSP value, and this process finishes at this time.

When the panel value is "pre/post-mute", the muted state is not reflected if the fader DSP value is changed because the ON/OFF DSP value is set to "OFF" to mute. Therefore, the panel value newly set at Step SE2 is reflected on the DSP value.

At Step SE7, as same as Step SC3 in FIG. 7 or Step SD5 in FIG. 8 described in the above, the DCA fader panel value kept in the DCA fader panel buffer 142 (FIG. 3) of the DCA fader 192 (FIG. 2) of the corresponding DCA group is obtained.

At Step SE8, the fader panel value of the input channel 252 updated at Step SE2 is obtained with reference to the input channel fader panel buffer 141 in FIG. 3.

At Step SE9, the DSP value of the fader 254 is changed based on the panel value of the DCA fader 191 obtained at Step SE7 and the panel value of the input channel fader 191 of the input channel 252 obtained at Step SE8. This is the same process as Step SA13 in FIG. 5, Step SC6 in FIG. 7 and Step SD8 in FIG. 8 described in the above; however, the panel value newly set at Step SE2 just reflects on the DSP value, and the state of the DCA mute is not changed. Then, the process proceeds to Step SE10 to finish the input channel fader process.

Figure 10:
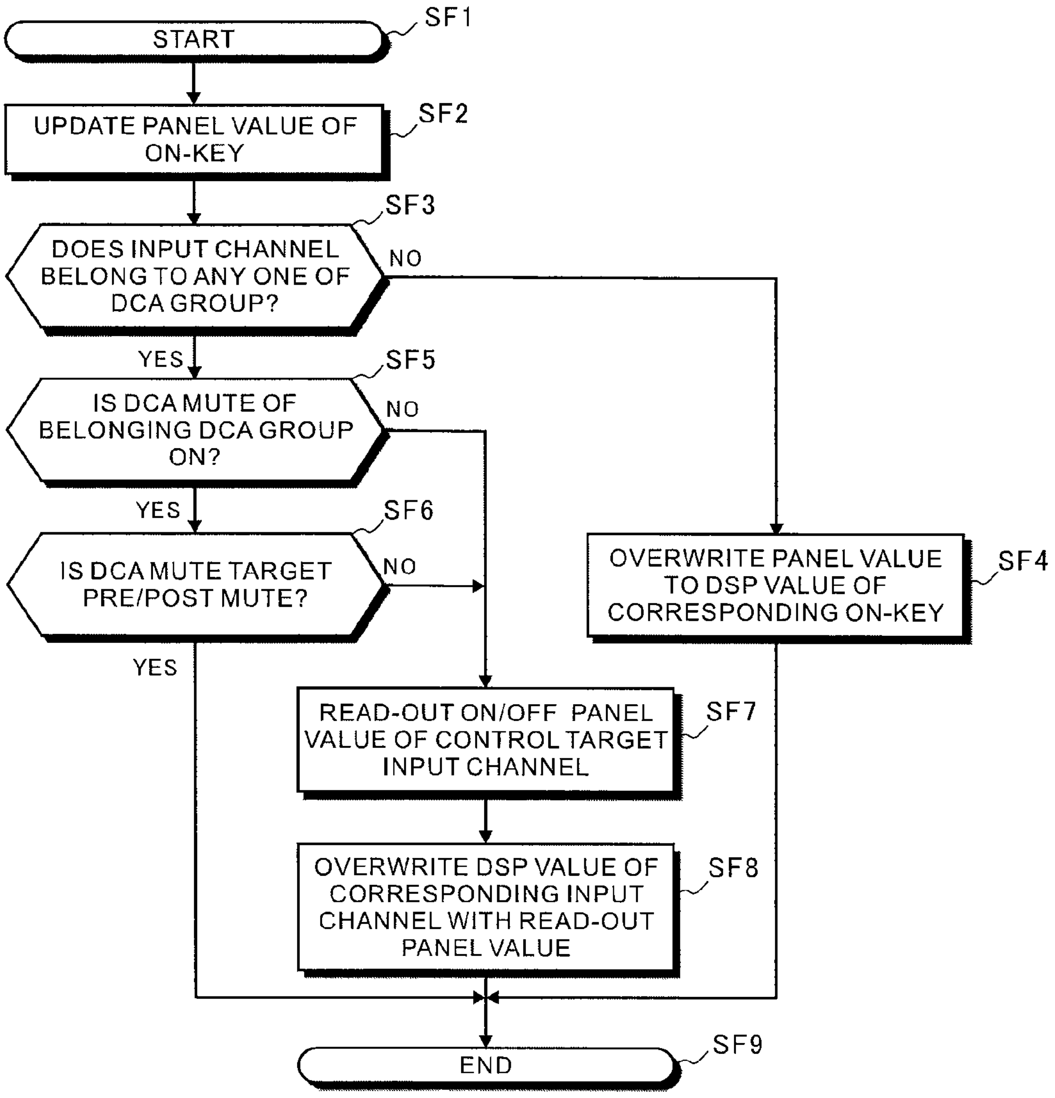
FIG. 10 is a flow chart showing an ON-key process according to the embodiment of the present invention.

FIG. 10 is a flow chart showing an ON-key process according to the embodiment of the present invention. This process is, for example, the process which is started when the instruction to change the ON-key panel value of the ON-key panel buffer 143 in FIG. 3 by operating the ON-key 226 in FIG. 2 by the user is detected. This process is, for example, controlled by the CPU 16 in FIG. 1. Moreover, this process is executed only for one input channel 252 corresponding to the ON-key 226 operated by the user as the process target.

At Step SF1, the ON-key process starts. At Step SF2, the ON-key panel value of the ON-key panel buffer 143 in FIG. 3 is overwritten from "ON" to "OFF" or from "OFF" to "ON" corresponding to the operation of the ON-key 262 that starts this process.

At Step SF3, it is judged whether the input channel (process target input channel) corresponding to the operated ON-key 226 belongs either of DCA groups. At this process, the DCA group to which the process target input channel belongs is extracted with reference to the panel value of each DCA group. When the process target input channel does not belong to any one of the DCA groups, the process proceeds to Step SF4 as indicated with an arrow "NO". When the process target input channel belongs to any one of the DCA groups, the process proceeds to Step SF5 as indicated with an arrow "YES".

At Step SF4, the ON/OFF DSP value in the DSP buffer 256 of the process target input channel is overwritten with the ON-key panel value updated at Step SF2. The ON-key panel value of the input channel to be the process target is overwritten to the ON/OFF DSP value of the input channel, and the state of the DSP25 is changed in accordance with the DSP value after updating.

At Step SF5, it is detected whether the DCA mute of the DCA group (the corresponding DCA group) belonging to the process target input channel is "ON" or not. For example, it is detected by obtaining the DCA mute panel value kept in the DCA mute panel buffer 145 (FIG. 3) of the DCA mute (FIG. 2) of the corresponding DCA group. When the DCA mute is "ON", the process proceeds to Step SF6 as indicated with an arrow "YES". When the DCA mute is "OFF", the process proceeds to Step SF7 as indicated with an arrow "NO". When there is plurality of the corresponding DCA groups, this process is executed for all of the DCA groups.

At Step SF6, it is judged whether the panel value of the DCA mute target is "pre/post-mute" or not. When the panel value is "pre/post-mute", the process proceeds to Step SF9 as indicated with an arrow "YES" to finish the ON-key process. When the panel value is "post-mute", the process proceeds to Step SF7 as indicated with an arrow "NO".

The ON-key process finishes when the panel value is "pre/post-mute" because the ON/OFF DSP value is set to "OFF" to mute and the mute function is released when the ON/OFF DSP value is changed. Therefore, the panel value newly set at Step SF2 cannot reflect on the DSP value, and this process finishes at this time.

When the panel value is "post-mute", the setting state of the DCA mute (fader DSP value) is not reflected if the ON/OFF DSP value is changed because the fader DSP value is set to $-\infty$dB to mute. However, when the panel value newly set at Step SF2 is reflected on the DSP value by the processes from Step SF7 to SF9, the mute state may change for the input channel of which the pre-signal is selected. That is, when the ON-key panel value is updated from "ON" to "OFF" at Step SF2, the mute function of the input channel of which the pre-signal is selected is released. When the ON/OFF panel value is updated from "OFF" to "ON" at Step SF2, mute function of the input channel of which the pre-signal is selected is set.

At Step SF7, the ON-key panel value of the input channel 252 updated at Step SF2 is obtained with reference to the ON-key panel buffer 143 in FIG. 3.

At Step SF8, the ON/OFF DSP value in the DSP buffer 256 of the corresponding input channel is overwritten with the ON-key panel value obtained at Step SF7. Then, the process proceeds to Step SF9 to finish the ON-key process.

Figure 11:
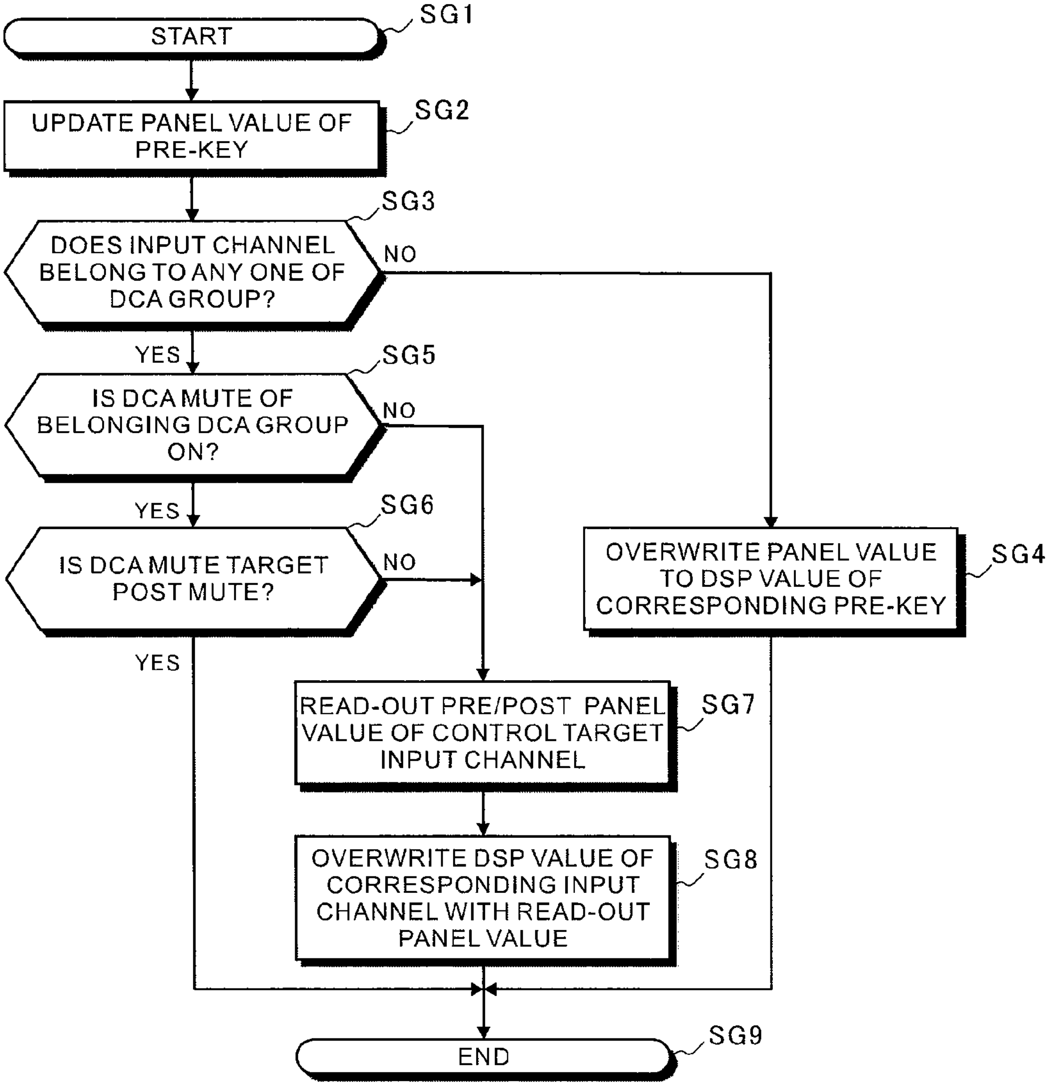
FIG. 11 is a flow chart showing a PRE-key process according to the embodiment of the present invention.

FIG. 11 is a flow chart showing a PRE-key process according to the embodiment of the present invention. This process is, for example, the process which is started when the instruction to change the PRE-key panel value of the PRE-key panel buffer 144 in FIG. 3 by operating the PRE-key 225 in FIG. 2 by the user is detected. This process is, for example, controlled by the CPU 16 in FIG. 1. Moreover, this process is executed only for one input channel 252 corresponding to the PRE-key 225 operated by the user as the process target.

At Step SG1, the PRE-key process starts. At Step SG2, the PRE-key panel value of the PRE-key panel buffer 144 in FIG. 3 is overwritten from the post-signal to the pre-signal (if the post-signal is set before operating the PRE-key) or from the pre-signal to the post-signal (if the pre-signal is set before operating the PRE-key) corresponding to the operation of the PRE-key 263 that starts this process.

At Step SG3, it is judged whether the input channel (process target input channel) corresponding to the operated PRE-key 225 belongs either of DCA groups. At this process, the DCA group to which the process target input channel belongs is extracted with reference to the panel value of each DCA group. When the process target input channel does not belong to any one of the DCA groups, the process proceeds to Step SG4 as indicated with an arrow "NO". When the process target input channel belongs any one of the DCA groups, the process proceeds to Step SG5 as indicated with an arrow "YES".

At Step SG4, the pre/post DSP value in the DSP buffer 256 of the process target input channel is overwritten with the PRE-key panel value updated at Step SG2. The PRE-key panel value of the input channel to be the process target is overwritten to the pre/post DSP value of the input channel, and the state of the DSP25 is changed in accordance with the DSP value after updating.

At Step SG5, it is detected whether the DCA mute of the DCA group (the corresponding DCA group) belonging to the process target input channel is "ON" or not. For example, it is detected by obtaining the DCA mute panel value kept in the DCA mute panel buffer 145 (FIG. 3) of the DCA mute (FIG. 2) of the corresponding DCA group. When the DCA mute is "ON", the process proceeds to Step SG6 as indicated with an arrow "YES". When the DCA mute is "OFF", the process proceeds to StepSG7 as indicated with an arrow "NO". When there is plurality of the corresponding DCA groups, this process is executed for all of the DCA groups.

At Step SG5, it is judged whether the panel value of the DCA mute target is "post-mute" or not. When the panel value is "post-mute", the process proceeds to Step SG9 as indicated with an arrow "YES" to finish the On-key process. When the panel value is "pre/post-mute", the process proceeds to Step SG7 as indicated with an arrow "NO".

The PRE-key process finishes when the panel value is "post-mute" in the post-mute mode because, for example, the mute function is released regardless of the DCA mute setting for the channel to the "pre-signal" when the pre/post DSP value of the input channel of which the post-signal is selected is changed even though originally only the post-signal is muted in the post-mute mode. Moreover, when the pre/post DSP value is changed to "post-signal" for the input channel of which the pre-signal is selected, the channel is muted. In each case, the process finishes without reflecting the panel value set at Step SG2 on the DSP value because the muted state is changed. Moreover, when change in the muted state as described in the above is necessary regardless of the DCA mute setting, the processes Step SG5 and Step SG6 are omitted, and Step SG7 and Step SG8 described later may be uniformly executed. Moreover, the user may select whether these processes are omitted or not.

When the panel value is "pre/post-mute", the muted state is not reflected on the setting state of the DCA mute (fader DSP value) if the pre/post DSP value is changed because the both of the pre-signal and the post-signal are muted. Therefore, the panel value newly set at Step SG2 is reflected on the DSP value by the processes Steps SG7 to SG9.

At Step SG7, the PRE-key panel value of the input channel 252 updated at Step SG2 is obtained with reference to the PRE-key panel buffer 144 in FIG. 3.

At Step SG8, the pre/post DSP value in the DSP buffer 256 of the corresponding input channel is overwritten with the PRE-key panel value obtained at Step SG9. Then, the process proceeds to Step SG9 to finish the ON-key process.

Moreover, in the PRE-key process in FIG. 11, the new value may certainly be reflected on the DSP value when the PRE-key 225 is operated. In this case, the processes are executed in sequence of Steps SG1, SG2, SG4 and SG9.

As described in the above, according to the embodiments of the present invention, plurality of the input channels can be grouped, and both of the pre-signal bypassing the fader and the post-signal via the fader or only the post-signal can be selected for the process target of the DCA mute function in the DCA mute function that collectively mutes the grouped plurality of the input channels.

Moreover, according to the embodiments of the present invention, only when the process target of the DCA mute is the post-signal, only the post-signal can be muted, for example, by declining the DSP value (actual set value) of the fader to minus infinity decibel (−∞dB) to make the volume of the post-signal to “0”. Moreover, when the process target of the DCA mute is both of the pre-signal and the post-signal, both of the pre-signal and the post-signal can be muted by disconnecting (OFF) the path from the input channel to the bus.

The embodiments of the present invention may be executed by a commercially available computer to which a computer program, etc. corresponding to the embodiments are installed. In this case, the operator groups positioned on the top panel 220 in FIG. 2 is displayed on the display 23, etc., and various operation in the above-described embodiments are executed by operating the displayed operator groups by using a pointing device such as a mouse and an alpha-numerical keyboard.

Moreover, in the above case, the computer program etc. corresponding to each embodiment may be provided to the user by storing them in a storage medium such as a CD-ROM, a floppy (trademark) disk, etc. that can be read by a computer.

Moreover, there is a function that is called a mute group other than the DCA group explained in the above-described embodiments. The mute group is a function to collectively mute the grouped plurality of the input channels, and all input channels belonging to the mute group selected at the mute key are muted. Mute of the mute group is executed by switching ON/OFF function of the input channel.

The present invention has been described in connection with the preferred embodiments. The invention is not limited only to the above embodiments. It is apparent that various modifications, improvements, combinations, and the like can be made by those skilled in the art.

What is claimed is:

1. An audio signal processing apparatus, comprising:
- a plurality of input channels, each for inputting an audio signal;
- a mix bus that mixes the audio signals input from the plurality of input channels;
- a volume level controller that controls a volume level of each input channel;
- a path disconnector that connects or disconnects a path from each input channel to the mix bus;
- a signal selector that select an audio signal to be input to the mix bus for each input channel from either a post-signal going through the volume level controller or a pre-signal bypassing the volume level controller;
- a volume adjusting operator that groups at least a part of the plurality of input channels and collectively adjusts volume levels of the grouped input channels;
- a mute setting device that sets muting of a mute target for the grouped input channels;
- a mute target selector that selects the mute target for the grouped input channels by selecting either a first mode in which only the post-signal of each of the grouped input channels is selected as the mute target or a second mode in which both the pre-signal and post-signal of each of the grouped input channels are selected as the mute target; and
- a mute controller that, when the mute setting device has set muting of the mute target for the grouped input channels, controls the volume level controller to execute the muting of the mute target if the first mode is selected, or controls the path disconnector to execute the muting of the mute target if the second mode is selected.

2. The audio signal processing apparatus according to claim 1, wherein the mute controller instructs the volume level controller to set a volume level of the audio signal to “0” on the first mode.

3. The audio signal processing apparatus according to claim 1, wherein the mute controller instructs the path disconnector to disconnect the path on the second mode.

4. A non-transitory computer readable medium including a program executable by a computer for realizing an audio signal process, the program comprising instructions for:
- mixing audio signals by a mix bus, the audio signals input from a plurality of input channels;
- controlling a volume level of each input channel;
- selecting an audio signal to be input to the mix bus for each input channel from either a post-signal of the input channel having been volume level controlled or a pre-signal of the input channel having bypassed being volume level controlled;
- grouping at least a part of the plurality of input channels and collectively adjusting volume levels of the grouped input channels;
- setting muting of a mute target for the grouped input channels; and
- selecting the mute target for the grouped input channels by selecting either a first mode in which only the post-signal of each of the grouped input channels is selected as the mute target or a second mode in which both the pre-signal and post-signal of each of the grouped input channels are selected as the mute target;
- wherein setting muting of the mute target for the grouped input channels includes controlling a volume level of each of the grouped input channels if the first mode is selected, or disconnecting a path to the mix bus from each of the grouped input channels if the second mode is selected.

* * * * *